United States Patent [19]

Herron, Jr.

[11] 4,417,294
[45] Nov. 22, 1983

[54] CAPACITIVE KEYSWITCH

[75] Inventor: John R. Herron, Jr., Park Ridge, Ill.

[73] Assignee: Illinois Tool Works Inc., Chicago, Ill.

[21] Appl. No.: 297,439

[22] Filed: Aug. 28, 1981

[51] Int. Cl.³ .......................... H01G 5/01; H01H 3/12
[52] U.S. Cl. .................... 361/288; 200/159 B
[58] Field of Search .............................. 361/288, 283;
400/479.1; 200/159 B, DIG. 1; 340/365 C

[56] References Cited

U.S. PATENT DOCUMENTS

| | | | |
|---|---|---|---|
| 3,133,170 | 5/1964 | Nanninga | 200/67 |
| 3,293,640 | 12/1966 | Calfin et al. | 345/365 |
| 3,308,253 | 3/1967 | Krakinowski | 200/159 B |
| 3,584,162 | 6/1971 | Krakinowski | 200/159 B |
| 3,676,607 | 7/1972 | Nash | 340/365 C |
| 3,693,059 | 9/1972 | Harris | 317/249 R |
| 3,702,284 | 11/1972 | Hans-Hermann | 204/15 |
| 3,710,209 | 1/1973 | Webb et al. | 317/249 R |
| 3,751,612 | 8/1973 | Hansen | 200/52 R |
| 3,797,630 | 3/1974 | Zilkha | 361/288 |
| 3,862,381 | 1/1975 | Glaister et al. | 200/5 A |
| 3,862,382 | 1/1975 | Glaister et al. | 200/5 A |
| 3,950,627 | 4/1976 | Murata et al. | 200/159 R |
| 3,951,250 | 4/1976 | Pointen et al. | 197/98 |
| 3,968,488 | 7/1976 | Bovio | 361/288 X |
| 3,973,091 | 8/1976 | Kaminski | 200/5 A |
| 3,995,126 | 11/1976 | Larson | 200/5 A |
| 3,996,429 | 12/1976 | Chu et al. | 200/5 A |
| 4,005,293 | 1/1977 | Boulanger | 200/5 A |
| 4,056,700 | 11/1977 | Stannek | 200/159 |
| 4,066,854 | 1/1978 | Zenk et al. | 200/5 A |
| 4,066,855 | 1/1978 | Zenk | 200/5 A |
| 4,207,448 | 6/1980 | Furusawa et al. | 200/159 B |
| 4,237,351 | 12/1980 | Boulanger et al. | 200/5 A |
| 4,245,138 | 1/1981 | Harper | 200/5 A |
| 4,254,309 | 3/1981 | Johnson | 200/5 A |
| 4,264,477 | 4/1981 | Seeger et al. | 252/503 |
| 4,287,553 | 9/1981 | Braunlich | 361/283 |
| 4,288,786 | 9/1981 | Ledniczki et al. | 340/365 |
| 4,288,836 | 9/1981 | Thornburg | 361/288 |

OTHER PUBLICATIONS

Sheldahl Flexswitch ® Product Bulletins 579 & 1180.
Bowmar Instrument Corporation Brochure 12 and 16 Station Standard Keyboards and 20 and 25 Station Universal Keyboards.

Primary Examiner—Donald A. Griffin
Attorney, Agent, or Firm—Donald D. Mondul; Thomas W. Buckman

[57] ABSTRACT

A capacitive keyswitch comprising a first circuit support, an electrically insulating spacer, a dielectric structure, a second circuit support and an actuating assembly for actuating the keyswitch; the first circuit support is flexible and carries thereupon a first conductive circuit, the first conductive circuit includes a first conductive land; the second circuit support carries thereupon a second conductive circuit, the second conductive circuit including a second conductive land; the spacer has an aperture therethrough; the first conductive land, the second conductive land, and the aperture are substantially in register with the first conductive land and the second conductive land being in facing relation with respect to each other; the dielectric structure is interposed between the first and second conductive lands; the actuating assembly comprises a plunger and a pad; the pad is interposed between the plunger and the first circuit support whereby application of a force urging the plunger toward the first circuit support urges the pad against the first circuit support and, through the pad, urges the first circuit support toward the second circuit support, whereby capacitance between the first conductive land and the second conductive land is varied as the force is varied.

3 Claims, 2 Drawing Figures

CAPACITIVE KEYSWITCH

BACKGROUND OF THE INVENTION

Thin contact membrane keyswitches do not offer the extreme high reliability of other types of keyswitches, for example, such as the magnetic core keyswitches of the type shown in U.S. Pat. No. 4,227,163, issued Oct. 7, 1980 to Raymond Barnoski and assigned to Illinois Tool Works Inc. Contact membrane keyswitches, however, do offer sufficient reliability for many applications at an appreciably lower cost. One type of contact membrane keyboard is described in the article entitled "Touch Panel Switches Are Based On Membrane Switch Concept," published in Computer Design, December 1979. In this type of keyswitch, two spaced-apart membrane layers coated with aligned conductive contact lands are separated in an aperture formed in a spacer. When the upper flexible membrane is depressed, contact is made between the upper and lower conductive lands to close the switch. Being a contact switch, however, it does have the inherent deficiencies of all contact switches which include wear, the possibility of oxidation and corrosion of the conductive areas, etc.

While capacitive keyswitches are desirable because of their potential greater reliability and longer life, such keyswitches as these have been designed in the past and have been appreciably more expensive than that of a simple contact membrane switch. Another membrane contact switch is disclosed in U.S. Pat. No. 3,676,607, issued July 11, 1972 to Donald H. Nash et al and assigned on its face to Bell Telephone Laboratories, Incorporated. This keyboard employed field effect transistors, and it was recognized that actual contact between the conductive lands did not have to occur because the field effect transistors could be controlled by capacitance change if contaminants intervened between conductive upper and lower lands. However, the keyswitch of this patent was still designed to be basically a mechanical switch; and moreover, the design led to a split lower land area configuration of two lower lands which resulted in a capacitive keyswitch in which the available capacitive plate area is divided in half and relatively complicated detection circuitry was required.

Another capacitive membrane keyboard is described in an article entitled "Capacitive Membrane Keyboard Bars Contamination," which appeared in Electronic Products Magazine, June 15, 1981 issue. This capacitive keyswitch is designed by Microswitch/Honeywell, and it employs an upper flexible membrane that carries a conductive land above a second membrane which has a second conductive land that is aligned with the upper conductive land. The two conductive lands are positioned in an aperture in a spacer which allows the upper member and land to be deflected towards the lower land until contact is made, thus the actual switching action is of the contact type. On the bottom of the lower membrane, however, there is another conductive area. The conductive coatings on both sides of the lower membrane, therefore, provide a fixed capacitance, while the moveable upper membrane provides a variable capacitance that is in series with the fixed capacitance. Although theoretically the two facing lands at a keyswitch do not have to be brought into contact with each other, in practice, they must be in such a close proximity that the keyswitch will rely on actual contact to operate.

In the present invention, the simple technology of the membrane contact keyswitch may be utilized with the only change required being the provision of a dielectric layer between the upper and lower conductive lands which thereby provides a keyswitch with a high capacitance that has the simple construction of a contact membrane keyswitch.

DESCRIPTION OF THE DRAWINGS

The present invention is described by reference to the drawings in which.

TECHNICAL DESCRIPTION OF THE INVENTION

Figure 1:
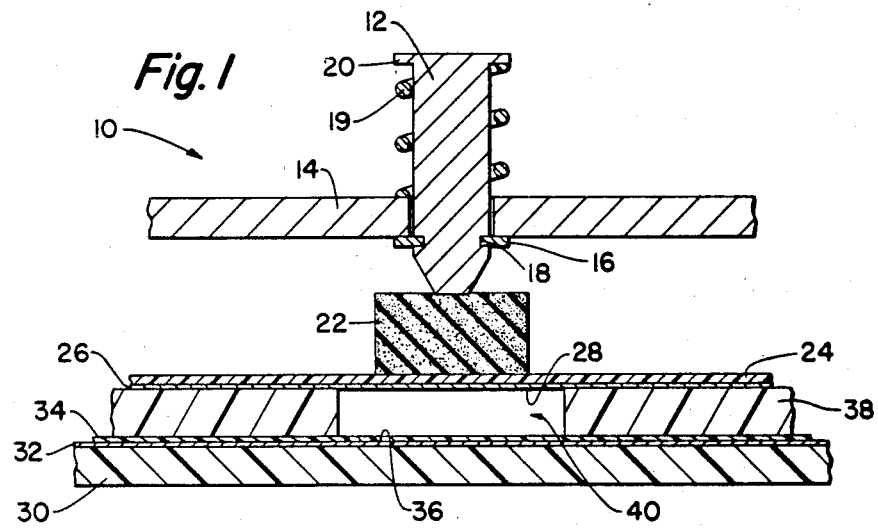
FIG. 1 is a cross-sectional view of a keyswitch of one embodiment of the keyboard in an unactuated condition.

The keyswitch of the present invention is illustrated by reference to the cross-sectional view of FIG. 1. The keyswitch 10 consists of an actuating plunger 12 which is attached to a keycap (not shown) and may be retained in chassis 14 by a retaining washer 16 in a groove 18 of the plunger or by other conventional retaining methods. A bias spring 19 may be connected between the top surface of the chassis and the bottom of the rim 20 of the plunger to provide for return of the plunger after release of pressure on it. The pad 22 of elastomeric material is disposed below the plunger 12, and it rests on the top surface of a flexible membrane 24 of a plastic film material, such as polyethylene, polypropylene, or other suitable material, such as MYLAR ®. The bottom surface of the flexible membrane 24 carries a first relatively thin film 26 of conducting metal which forms an interconnecting circuit pattern including conductive land 28. A base 30 has a second thin film 32 of conducting metal on it which forms a second interconnecting circuit pattern including conductive land 36 that is aligned with the first land 28. A relatively thick dielectric spacer 38, which may be a MYLAR ® film, is interposed between the thin film 28, 36 which separate the conductive lands in the aperture 40.

Figure 2:
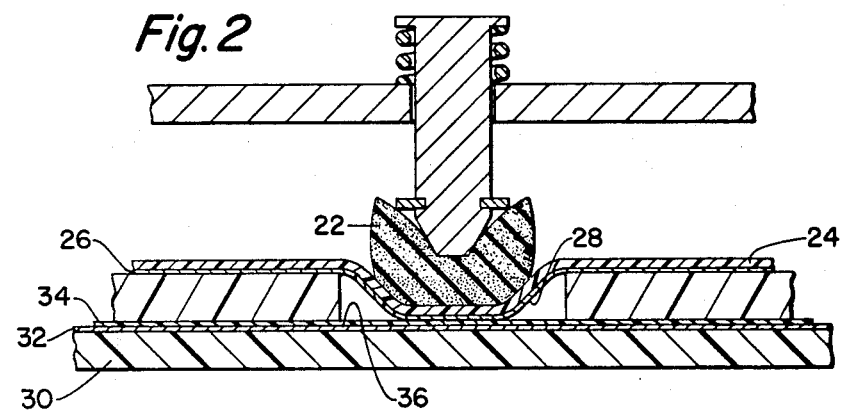
FIG. 2 is a cross-sectional view of the keyswitch of FIG. 1 in an actuated condition.

In the illustrated embodiment of the present invention, a thin dielectric layer 34, such as any suitable plastic film material used for film capacitors, and which has a much thinner dimension than the spacer 38, is placed over the conducting film 32 and the land 36. The film 32 is shown as being deposited directly on the supporting base 30 although the film 32 could be deposited on a second plastic dielectric layer supported by the base instead of on the base itself. When the plunger 12 is depressed, the elastomeric pad 22 acts as a cushion which protects the upper membrane 24 and provides overtravel. The pad 22 also provides a measure of return bias force when pressure on the plunger 12 is released. When the conductive lands 28 and 36 are in close proximity to each other, as shown in FIG. 2, due to the depression of the plunger 12, the thin dielectric separating layer 34 contacts both of the lands 28, 36 and this results in a relatively large capacitance value when the switch is in the actuated position, illustrated in FIG. 2.

The keyswitch of the present invention can also achieve the desired high ratio of ON to OFF capacitance by replacing the illustrated thin film 34 plastic layer with any other suitable dielectric material such as a conventional polymer dielectric film layer deposited on either, or both, of the facing surface lands 28 and 36. Another approach to providing a desired dielectric insulation layer would be to utilize a readily oxidizable metal for one or both of the lands 28, 36, for example, aluminum or tantalum, which has its surface oxidized to provide a very thin insulating layer and a high dielectric constant which would enable manufacture of a still thinner keyswitch.

What is claimed is:

1. A capacitive keyswitch comprising a first circuit support, an electrically insulating spacer, a dielectric structure, a second circuit support, and actuating means for actuating the keyswitch; said first circuit support being flexible and carrying thereupon a first conductive circuit, said first conductive circuit including a first conductive land; said second circuit support carrying thereupon a second conductive circuit, said second conductive circuit including a second conductive land; said spacer having an aperture therethrough; said first conductive land, said second conductive land, and said aperture being substantially in register with said first conductive land and said second conductive land being in facing relation with respect to each other; said dielectric structure being interposed between said first and second conductive lands; said actuating means comprising a plunger and a pad; said pad being interposed between said plunger and said first circuit support whereby application of a force urging said plunger toward said first circuit support urges said pad against said first circuit support and through said pad, urges said first circuit support toward said second circuit support, whereby capacitance between said first conductive land and said second conductive land is varied as said force is varied.

2. A capacitive keyswitch as recited in claim 1 wherein said pad is elastomeric.

3. A capacitive keyswitch as recited in claim 1 wherein said dielectric structure is a thin dielectric film layer.

* * * * *